United States Patent
Takahashi et al.

(10) Patent No.: US 8,017,439 B2
(45) Date of Patent: Sep. 13, 2011

(54) DUAL CARRIER FOR JOINING IC DIE OR WAFERS TO TSV WAFERS

(75) Inventors: Yoshimi Takahashi, Beppu (JP); Masood Murtuza, Sugarland, TX (US); Rajiv Dunne, Murphy, TX (US); Satyendra Singh Chauhan, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 54 days.

(21) Appl. No.: 12/694,012

(22) Filed: Jan. 26, 2010

(65) Prior Publication Data
US 2011/0183464 A1   Jul. 28, 2011

(51) Int. Cl.
*H01L 21/44*   (2006.01)
(52) U.S. Cl. ........ 438/109; 438/108; 438/118; 438/459; 257/E21.499
(58) Field of Classification Search .................. 438/108, 438/109, 118, 459
See application file for complete search history.

(56) References Cited

U.S. PATENT DOCUMENTS

| | | | |
|---|---|---|---|
| 7,688,382 B2 * | 3/2010 | Nishida et al. | 348/374 |
| 7,915,080 B2 * | 3/2011 | Takahashi et al. | 438/108 |
| 2008/0230913 A1 | 9/2008 | Huang et al. | |
| 2009/0280602 A1 | 11/2009 | Bonifield et al. | |
| 2010/0178766 A1 * | 7/2010 | Andry et al. | 438/692 |
| 2010/0320575 A9 * | 12/2010 | Chauhan | 257/621 |

* cited by examiner

*Primary Examiner* — Alexander G Ghyka
(74) *Attorney, Agent, or Firm* — Yingsheng Tung; Wade J. Brady III; Frederick J. Telecky, Jr.

(57) ABSTRACT

A method of forming stacked electronic articles using a through substrate via (TSV) wafer includes mounting a first carrier wafer to a top side of the TSV wafer using a first adhesive material that has a first debonding temperature. The TSV wafer is thinned from a bottom side of the TSV wafer to form a thinned TSV wafer. A second carrier wafer is mounted to the bottom side of the TSV wafer using a second adhesive material that has a second debonding temperature that is higher as compared to the first debonding temperature. The thinned TSV wafer is heated to a temperature above the first debonding temperature to remove the first carrier wafer from the thinned TSV wafer. At least one singulated IC die is bonded to TSV die formed on the top surface of the thinned TSV wafer to form the stacked electronic article.

20 Claims, 10 Drawing Sheets

US 8,017,439 B2

DUAL CARRIER FOR JOINING IC DIE OR WAFERS TO TSV WAFERS

FIELD

Disclosed embodiments relate to integrated circuit (IC) assembly processing, and more particularly to bonding die or wafers to TSV comprising wafers.

BACKGROUND

In order to stack IC die in a face-to-face manner using standard flip-chip assembly techniques, the assembly is conventionally performed in a sequential manner by bonding a first thinned IC die then a second thinned IC die (e.g., a thinned die 25 to 150 µm thick) onto a package substrate (e.g., PCB). In a typical arrangement, the first IC die can be a TSV comprising die that is mounted face (i.e. active circuit/top side) up on the surface of a package substrate where the TSVs form joints with pads on the package substrate surface. Capillary underfill is then generally performed. The second IC die is then generally flip-chip (FC) mounted to the top side of the first IC die.

Problems with this conventional sequential stacked die assembly technique include difficulties with die-to die jointing via bumps because the first IC die mounted on the package substrate may have significant warpage/bow. In addition, since both IC die are thinned and the top sides are exposed during assembly, IC die handling is generally difficult and can result in yield loss due to cracked IC die or scratching of the IC die.

Stacked die can also be formed by die-to-wafer methods (D2W). In one known D2W method, die-wafer stacks are formed by thinning a TSV wafer (e.g. to <100 µm thick) using a carrier wafer bonded to the top side of the TSV wafer to expose the TSVs tips on the bottom side of the TSV wafer. The carrier wafer is then removed and then the IC die are bonded to the top side of the thinned TSV wafer. However, warpage of the thinned TSV wafer can complicate jointing/bonding with the IC die. For example, as known in the art, warpage results in misaligned joints which reduces contact area which increases contact resistance of the joint, particularly for fine pitched pads, and can even cause open circuited contacts.

Moreover, conventional thin die-wafer stacks are difficult to handle which can result in scratching and a tendency to crack. In a second known D2W method, thinned IC die are bonded to the top of a TSV wafer and then the TSV is thinned from its bottom side to expose the TSVs on the bottom side of the TSV wafer. Due to warpage/bending of the TSV wafer during TSV tip exposure which increases as the wafer thinning precedes, this second known D2W method can result in significant TSV tip height variation including significant height variation across individual IC die which can cause bonding problems during subsequent bonding of the TSV tips of the die stack to a package substrate.

The bonding of wafers to TSV wafers (W2W) shares some of the same challenges that are described above with respect to the D2W methods. Accordingly, new assembly processes are needed for bonding die or wafers to TSV comprising wafers.

SUMMARY

Disclosed embodiments provide solutions to the problems of warpage/bow, and scratching described above when bonding die or wafers to TSV comprising wafers to form stacked TSV wafer comprising electronic articles, which can be singulated to form thin die stacks including at least one TSV die. A first carrier wafer is mounted to the top surface of a TSV wafer comprising a plurality of IC die using a first adhesive material having a first debonding temperature. The TSV wafer is then thinned from its bottom side to form a thinned TSV wafer to expose the embedded TSV tips. Since a flat carrier wafer supports the TSV wafer during thinning, the resulting TSV tip height variation is significantly reduced as compared to the second D2W method described above.

With the first carrier wafer still bonded to the top of the TSV wafer, a second carrier wafer is then mounted to the bottom side of the TSV wafer using a second adhesive material to sandwich the TSV wafer. The second adhesive material has a second debonding temperature that is higher as compared to the debonding temperature of the first adhesive. The first carrier wafer is then selectively removed from the top side of the TSV wafer by heating to a temperature that is above the first debonding temperature, but is below the second debonding temperature so that the second carrier wafer remains attached to the TSV wafer.

At least one second IC die which can comprise singulated IC die or a wafer is then bonded to the plurality TSV die on the top side of the thinned TSV wafer to form a stacked TSV wafer comprising electronic article. Since the TSV wafer is supported by the second carrier wafer during bonding of the singulated IC die or wafer, warpage/bow is significantly reduced which reduces the contact resistance of the joints, and as a result improves circuit performance and reliability of singulated stacked IC die generated by singulation (e.g. sawing) of the stacked TSV wafer comprising electronic article.

DETAILED DESCRIPTION

Figure 1:
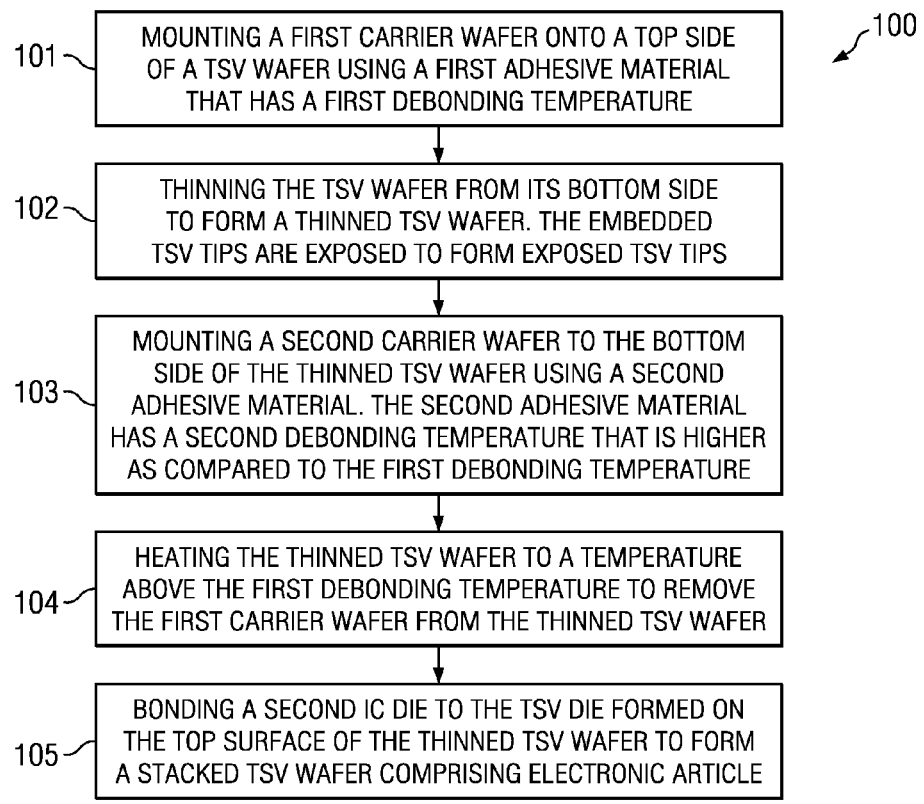
FIG. 1 is a flow chart that shows steps in an exemplary method for forming a stacked TSV wafer comprising electronic article from a TSV wafer including a plurality of TSV die that each include TSV precursors having embedded TSV tips and at least one second IC die, according to a disclosed embodiment.

Disclosed embodiments are described with reference to the attached figures, wherein like reference numerals are used throughout the figures to designate similar or equivalent elements. The figures are not drawn to scale and they are provided merely to illustrate the disclosed embodiments. Several disclosed aspects are described below with reference to example applications for illustration. It should be understood that numerous specific details, relationships, and methods are set forth to provide a full understanding of the disclosed embodiments. One having ordinary skill in the relevant art, however, will readily recognize that embodiments of the invention can be practiced without one or more of the specific details or with other methods. In other instances, well-known structures or operations are not shown in detail to avoid obscuring the disclosure. The disclosed embodiments are not limited by the illustrated ordering of acts or events, as some acts may occur in different orders and/or concurrently with other acts or events. Furthermore, not all illustrated acts or events are required to implement a methodology in accordance with embodiments of the invention.

Disclosed embodiments include dual carrier wafer methods for forming stacked TSV wafer comprising electronic articles that upon singulation provide a plurality of singulated stacked IC die. As used herein a "TSV wafer" includes a top side including a plurality of TSV die formed thereon comprising active circuitry and "TSV precursors" including embedded TSV tips, and a bottom side. The term "TSV precursor" refers to a structure that following thinning from the bottom side of the TSV wafer is sufficient to provide electrical access to the TSV tips so that the TSV precursors provide through substrate electrical connectivity. As known in the art, active circuitry generally comprises circuit elements including transistors, diodes, capacitors, and resistors, as well as signal lines and other conductors that interconnect these various circuit elements.

FIG. 1 is a flow chart that shows steps in an exemplary dual carrier method 100 for forming stacked TSV wafer comprising electronic articles from a TSV wafer, according to a disclosed embodiment. Step 101 comprises mounting a first carrier wafer onto a top side of the TSV wafer using a first adhesive material that has a first debonding temperature. The carrier wafer can comprise quartz or silicon, for example. The TSV wafer is generally a thick wafer defined herein to have a thickness of at least 100 µm, that is typically at least 200 µm (e.g. 500 to 800 µm) thick.

In step 102 the TSV wafer is thinned from its bottom side to form a thinned TSV wafer. The TSV wafer is generally thinned to a thickness of at least 25 µm, typically from 25 µm to 150 µm. The thinning includes exposing the embedded TSV tips from the bottom side of the thinned TSV wafer to form exposed TSV tips. In one embodiment the exposed TSV tips protrude from the bottom side of the TSV wafer at least 5 µm, such as 5 to 50 µm. In another embodiment, the TSV tips do not protrude from the bottom side of the wafer, and a redistribution layer (RDL) on the bottom side of the wafer provides contact to the exposed TSV tips.

Step 103 comprises mounting a second carrier wafer to the bottom side of the thinned TSV wafer using a second adhesive material. The second adhesive material has a second debonding temperature that is higher as compared to the first debonding temperature so that the second adhesive maintains attachment of its carrier wafer while the first adhesive debonds to allow removal of the first carrier wafer. The difference in debonding temperatures is generally at least 10° C., and is more typically at least 20° C., such as 50° C., or more.

The respective adhesives can be selected from thermoplastics, thermosets, with the option for light (e.g. UV) curable polymers in each case.

Step 104 comprises heating the thinned TSV wafer to a temperature above the first debonding temperature to remove the first carrier wafer from the thinned TSV wafer. The temperature in step 104 is low enough to maintain the second adhesive in place so that the second carrier wafer remains attached. For example, in one embodiment, once the viscosity of the first adhesive falls to approximately 100 Pa·S (or lower), such as by heating to about 250° C., with the second adhesive selected to be stable at the selected debonding temperature, selective debonding of the first adhesive can take place. Solvent treatment may be applied to remove residual first adhesive.

Step 105 comprises bonding a second IC die to the TSV die formed on the top surface of the thinned TSV wafer to form stacked TSV wafer comprising electronic article. The second IC die can comprises one or more singulated second IC die. In this embodiment, the stacked TSV wafer comprising electronic article comprises a die-TSV wafer stack. The second IC die can also comprise a wafer that comprises a plurality of second IC die. In this embodiment the stacked TSV wafer comprising electronic article comprises a wafer-TSV wafer stack.

The bonding can be FC bonding. In other embodiments, such as when the second IC die includes TSVs, the second IC die can be bonded top side (i.e. active circuit side) up on the top surface of the TSV wafer. Although generally described herein wherein a second IC die is bonded to the thinned TSV wafer, those having ordinary skill in the art will recognize that die or wafer stacks comprising a plurality of stacked second IC die (e.g., stacks of 2, 3 or more die and/or wafers) may be bonded to the thinned TSV wafer based on methodologies disclosed herein.

The second carrier wafer can then be removed from the stacked TSV wafer comprising electronic article. The second adhesive can be removed in a variety of ways, including thermally and non-thermally (e.g. laser removal). Following removal of the second carrier wafer, the TSV wafer comprising electronic article can be singulated (e.g. sawed) to form a plurality of stacked IC die which can then be mounted onto a package substrate (e.g. organic substrate) as described below with respect to several exemplary embodiments.

FIGS. 2A-G show successive cross sectional depictions associated with an exemplary dual carrier FC method for forming TSV wafer comprising electronic articles, according to a disclosed embodiment. For simplicity, the conventional dielectric liner and the metal diffusion barrier layer that is present for TSVs having metal fillers such as copper are both not shown in the FIGs. provided herein. Moreover, as noted above, although disclosed embodiments may generally be described as being FC assembly methods, when the second IC die or wafer including second IC die mounted onto the thinned TSV wafer itself includes TSVs, the second die can be mounted top side/face up.

Figure 2A:
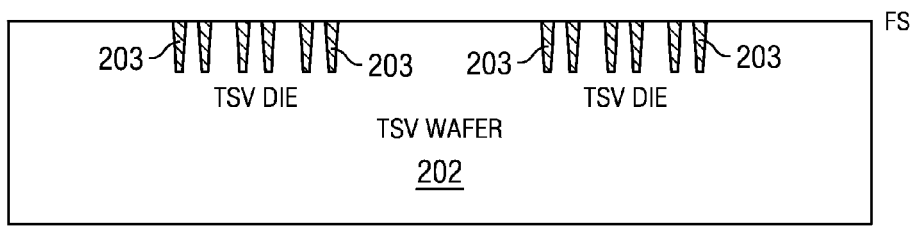
FIGS. 2A-G show successive cross sectional depictions associated with an exemplary dual carrier FC method for forming die-TSV wafer stacks or wafer-TSV wafer stacks, according to a disclosed embodiment.
Figure 2B:
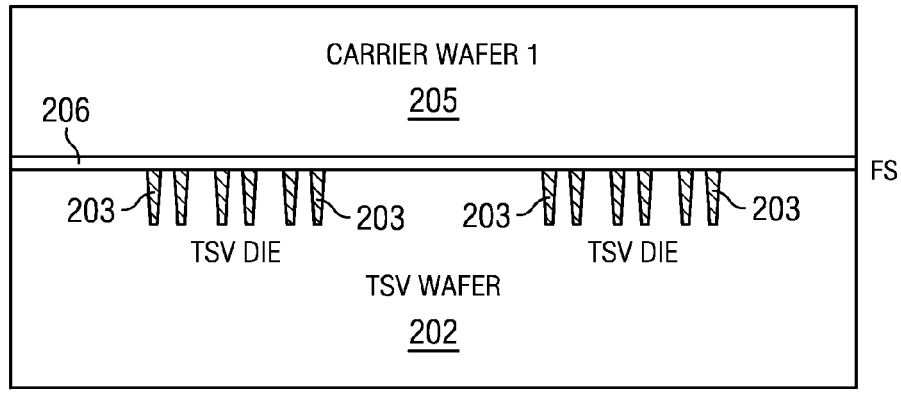
Figure 2C:
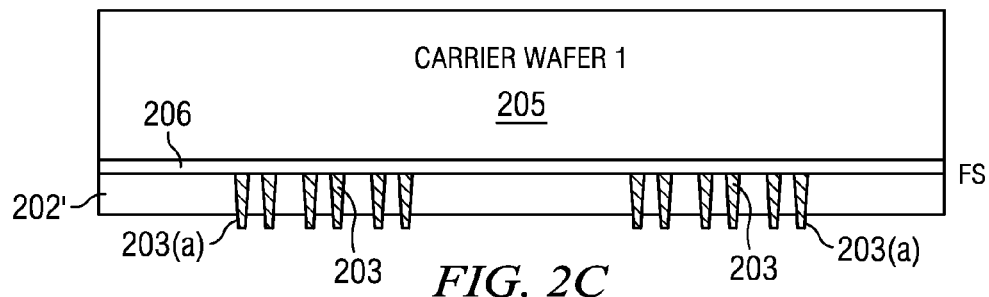

After completing wafer Fab processing (e.g., passivation processing), a TSV wafer 202 having embedded TSVs 203 and a plurality of TSV die is shown in FIG. 2A. "FS" in the FIGs. corresponds to the front/top side of the die or wafer, while "BS" corresponds to the/bottom side of the die or wafer. As shown in FIG. 2B, a first carrier wafer 205 is mounted to a top side of the TSV wafer 202 using a first adhesive material 206 that has a first debonding temperature. FIG. 2C shows a depiction after thinning of the TSV wafer (e.g. backgrinding) to form a thinned TSV wafer 202' comprising TSVs 203 having exposed TSV tips 203(a).

Figure 2D:
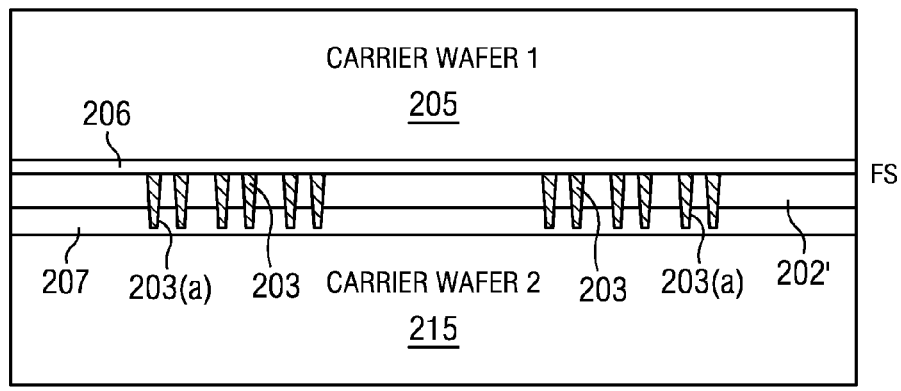
Figure 2E:
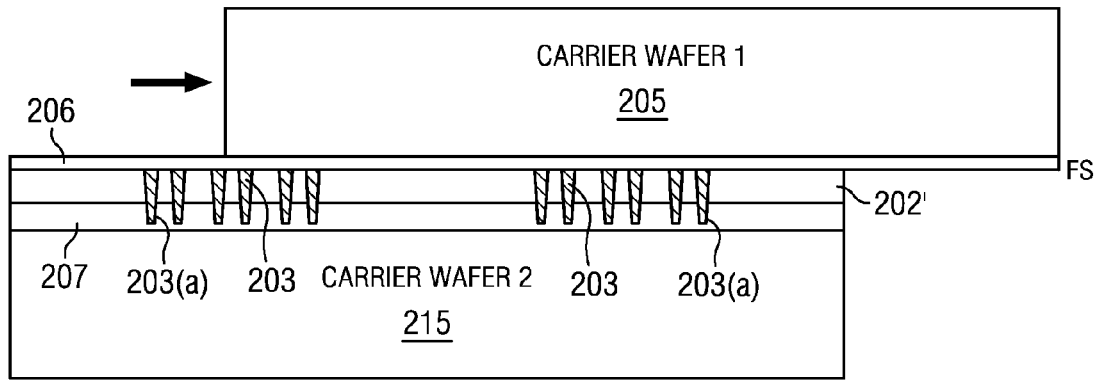

FIG. 2D shows a cross sectional depiction after mounting a second carrier wafer 215 to the bottom side of the thinned TSV wafer 202' using a second adhesive material 207. As described above, the second adhesive material 207 has a second debonding temperature that is higher as compared to the first debonding temperature. FIG. 2E show a cross sectional depiction after heating allowing removal of the first carrier wafer 205 from the thinned TSV wafer 202'. The second carrier wafer 215 remains attached to the thinned TSV wafer 202' by second adhesive 207.

Figure 2F:
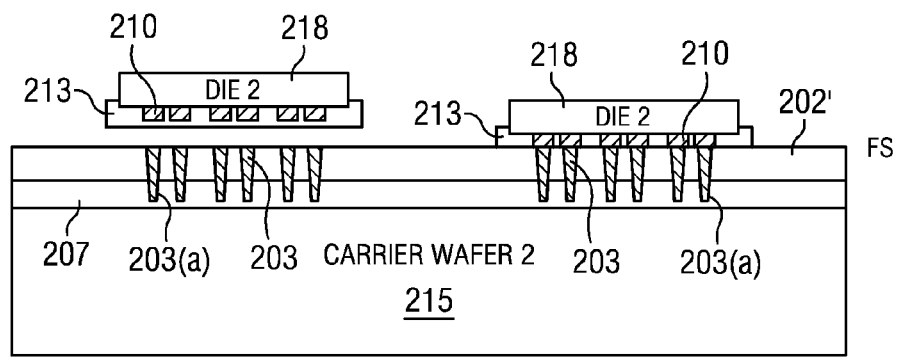

As described above, the second IC die can comprises one or more singulated IC die. In this embodiment, the stacked TSV wafer comprising electronic article formed comprises a die-TSV wafer stack. FIG. 2F shows a cross sectional depiction after bonding singulated second IC die shown as Die 2 218 to the front side of a plurality of TSV Die formed on the top side of the thinned TSV wafer 202' to form a die-wafer stack. Die 2 218 is shown having a plurality of bonding conductors (bumps) 210 for FC jointing. Die 2 can be a semiconductor IC, MEMS device or MEMS comprising IC, or a passive device.

Figure 2G:
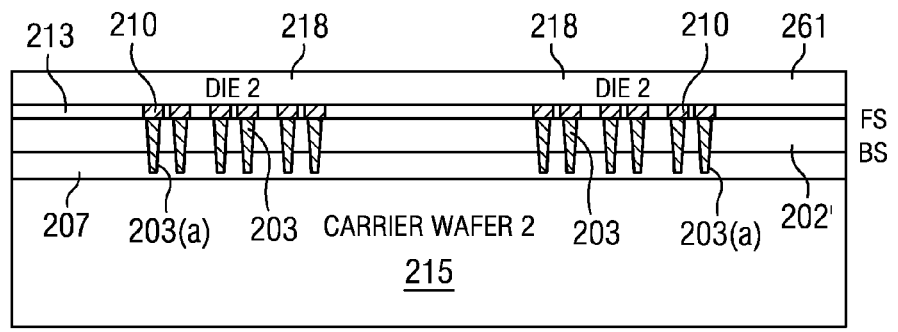

As described above, the second IC die can also comprise a wafer that comprises a plurality of second IC die. In this embodiment the stacked TSV wafer comprising electronic article formed comprises a wafer-TSV wafer stack. FIG. 2G shows a cross sectional depiction after bonding a wafer 261 comprising a plurality of second IC die shown as Die 2 218 to the front side of a plurality of TSV Die formed on the top side of the thinned TSV wafer 202' to form a wafer-TSV wafer stack. Die 2 218 is shown having a plurality of bonding conductors (bumps) 210 for FC jointing. As noted above, Die 2 218 can be a semiconductor IC, MEMS device or MEMS comprising IC, or a passive device. A curable dielectric film (CDF) 213 is shown between Die 2 218 in FIG. 2F and the FS of thinned TSV wafer 202' and between wafer 261 in FIG. 2G and the FS of thinned TSV wafer 202' The CDF 213 allows compression bonding to simultaneously form joints as well as form an underfill material using a pressing force (pressure) sufficient to result in the bumps 210 for FC jointing on the Die 2 218 penetrating into the CDF layer 213 to form metallic joints between the bumps 210 and the bonding features on the FS of the TSV Die on the top side of the thinned TSV wafer 202', with a heat sufficient to result in the CDF 213 forming an underfill layer (e.g., cross-linking).

Typical heat pressing conditions during compression bonding can comprise a temperature of 150-180° C., force/area (pressure) during pressing of 35-133 Kgf/cm$^2$, and a pressing time between 100-180 sec. Accordingly, in this embodiment a conventional underfill process, such as capillary underfill or a non-conductive paste (NCP) process, is unnecessary.

The CDF 213 can be applied (e.g., laminated) to the top/front side (FS) of the Die 2 218. The CDF material prior to curing generally provides a low melt viscosity, such as lower than 500 to 1,000 Pascal-second (Pa·s), and fast curability, such as a 30 second cure time for a temperature of at least 180° C. The CDF 213 can include an optional filler, with the wt. % of the filler in one embodiment based on matching the coefficient of thermal expansion (CTE) of the CDF to the CTE of the lamination area surface. The thickness of the CDF 213 is generally calculated to fill nominal underfill gap area with an additional thickness amount to reflect a manufacturability margin. For example, if the underfill gap is 10 μm, the thickness of the CDF can be from 15 to 20 μm. The CDF material can include flux. As known in the art, a flux refers to a chemically- or physically-active formulation capable of cleaning oxides and enabling wetting of metals (e.g., copper) with solder. Flux is generally included in the CDF when the bonding conductors include highly oxidizable metals, such as copper. Metallic joints are not formed at this step. As described below, the CDF enables heat pressing to form an underfill layer and provides bonding in a single assembly step.

Figure 3A:
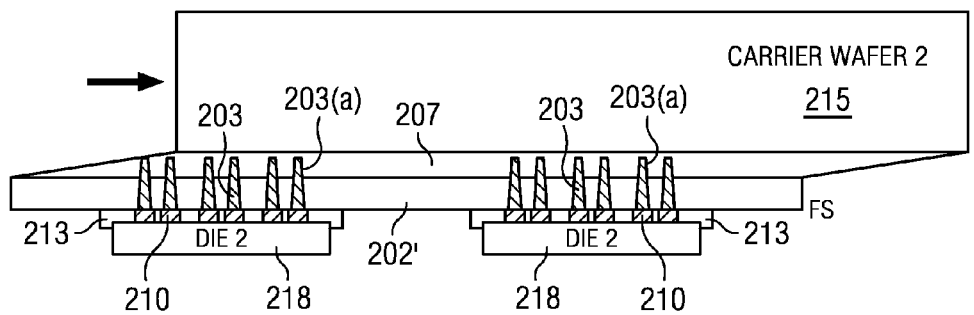
FIGS. 3A-H show successive cross section depictions associated with exemplary mold-free assembly flows for forming singulated die stacks from a die-wafer stack, and then bonding the singulated die stack to a package substrate, according to a disclosed embodiment.
Figure 3B:
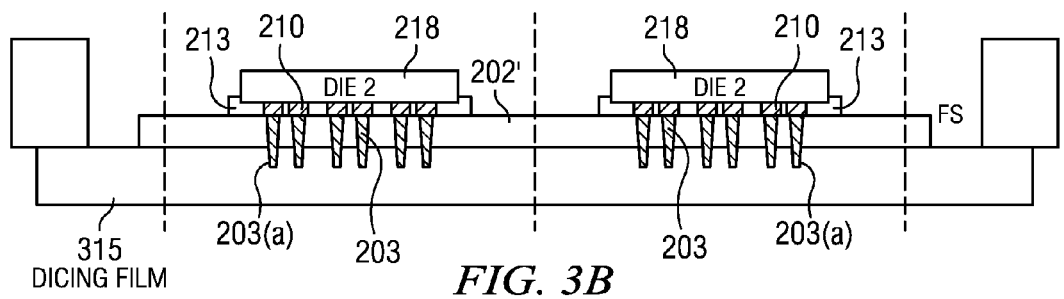

FIGS. 3A-H show successive cross section depictions associated with exemplary mold-free assembly flows for forming singulated die stacks from a die-wafer stack, and then bonding the singulated die stack to a package substrate, according to a disclosed embodiment. The package substrate can comprise an organic or ceramic printed circuit board (PCB), for example. FIG. 3A shows a cross sectional depiction depicting the removal of the second carrier wafer 215 from the die-wafer stack shown in FIG. 2F. FIG. 3B shows a cross sectional depiction depicting the mounting of the carrier waferless die-wafer stack onto a dicing film 315.

Figure 3C:
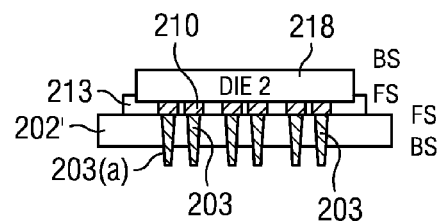
Figure 3D:
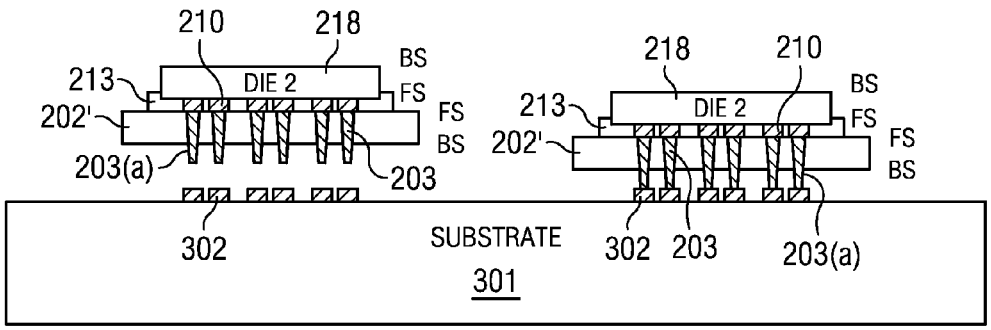
Figure 3E:
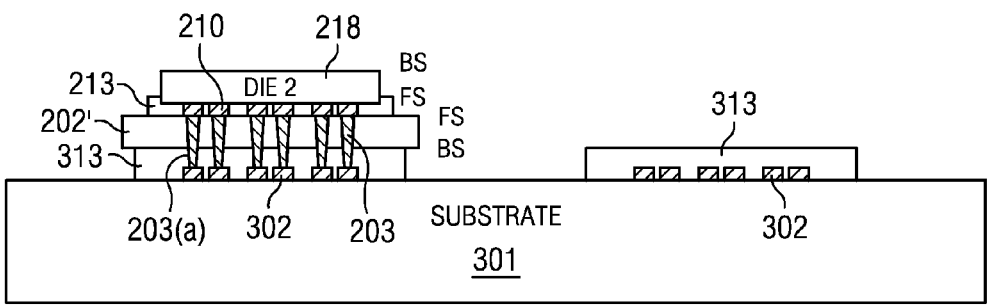

FIGS. 3C-E depict a mold-free capillary underfill flow assembly option. FIG. 3C depicts the result following wafer sawing the die-wafer stack shown in FIG. 3B to provide a plurality of singulated stacked die. FIG. 3D depicts mounting singulated stacked die onto a package substrate 301 that includes pads 302 using a process comprising TC bonding or mass reflow. FIG. 3E depicts the resulting structure after capillary underfill to dispose underfill 313 in the gap region between the bottom of the singulated stacked die and the surface of the substrate 301.

Figure 3F:
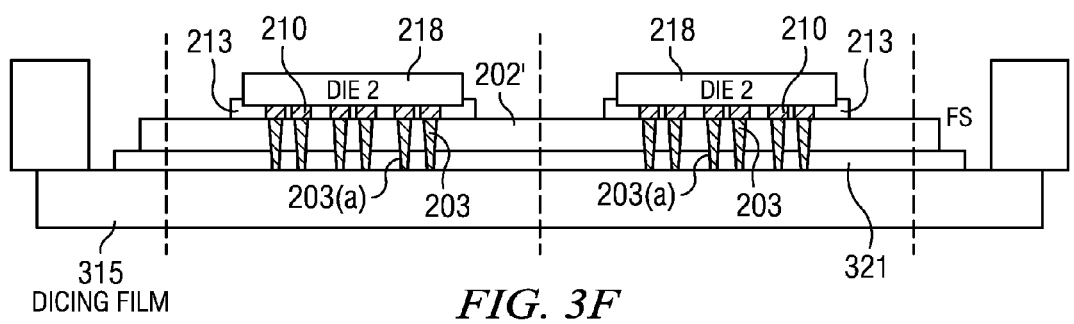
Figure 3G:
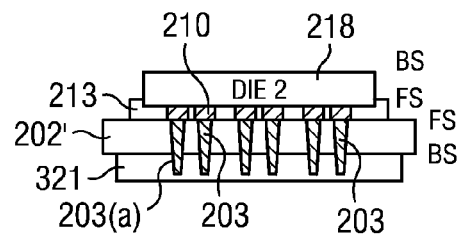
Figure 3H:
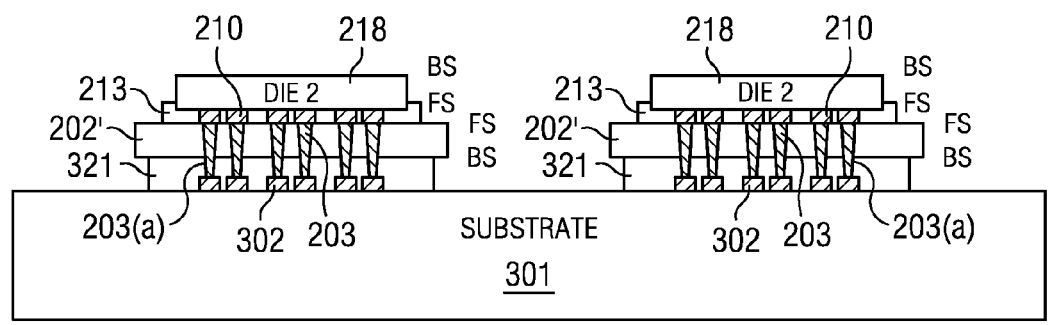

FIGS. 3F-H depict a mold-free pre-applied underfill assembly option. FIG. 3F depicts placing a CDF film 321 between the die-wafer stack shown in FIG. 2F and a dicing film 315. FIG. 3G depicts wafer a singulated stacked die provided following sawing the die-wafer stack shown in FIG. 3F. FIG. 3H depicts the resulting structure after placing of singulated stacked die on a package substrate and compression bonding that results in bonding of the singulated stacked die to pads on the package substrate and also the formation of an underfill material from the CDF 321 between the singulated stacked die and the package substrate.

Figure 4A:
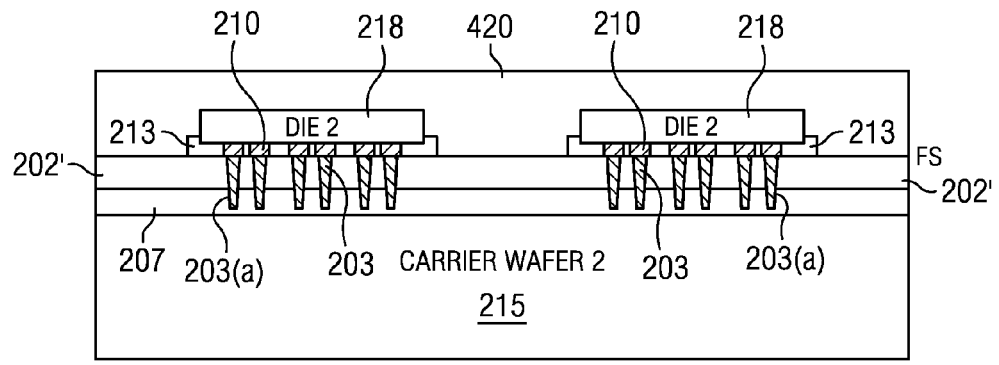
FIGS. 4A-I show successive cross section depictions associated with exemplary mold comprising assembly flows for forming singulated die stacks from a die-wafer stack, and then bonding the singulated die stack to a package substrate, according to a disclosed embodiment.
Figure 4B:
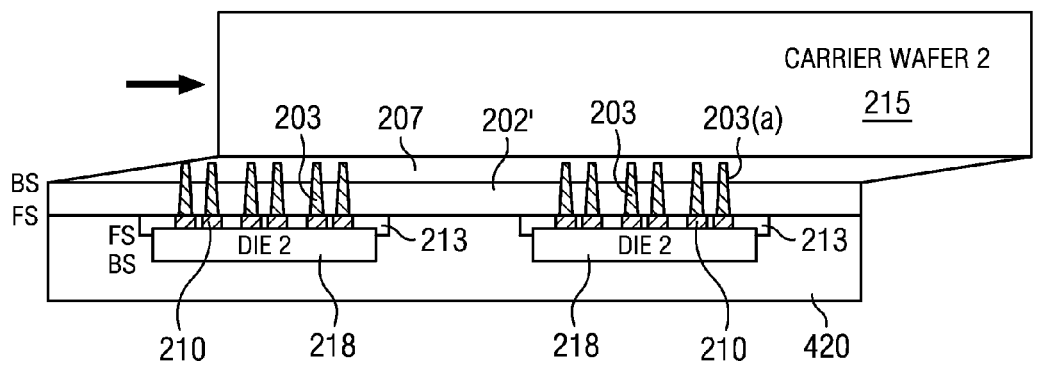
Figure 4C:
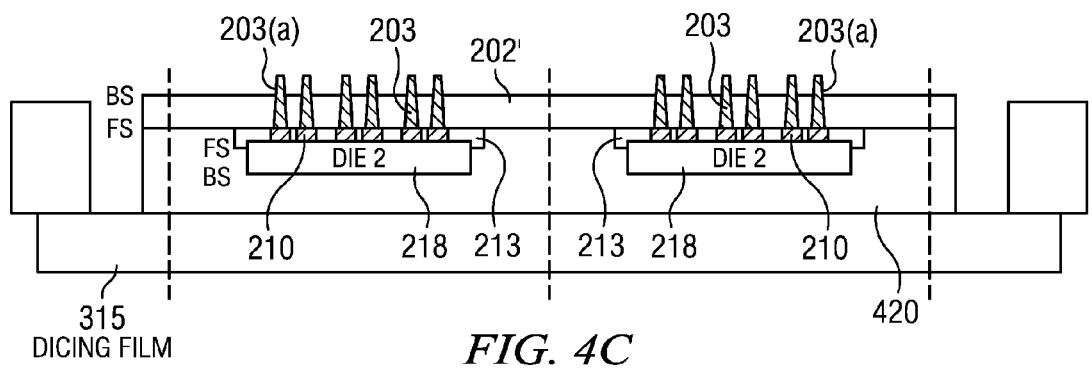

FIGS. 4A-I show successive cross section depictions associated with exemplary mold comprising assembly flows for forming singulated die stacks from a die-wafer stack, and then bonding the singulated die stack to a package substrate, according to a disclosed embodiment. FIG. 4A shows a depiction after application of a mold material 410 to the die-wafer stack shown in FIG. 2F. FIG. 4B shows a cross sectional depiction depicting the removal of the second carrier wafer 215 from the die-wafer stack. FIG. 4C depicts mounting the molded die-wafer stack TSV tip 203(a) side up on a dicing film 315.

Figure 4D:
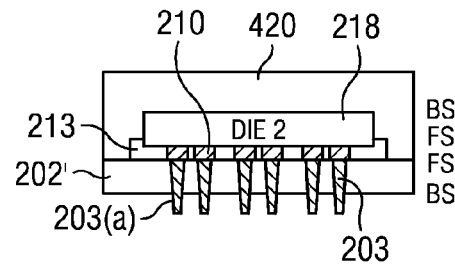
Figure 4E:
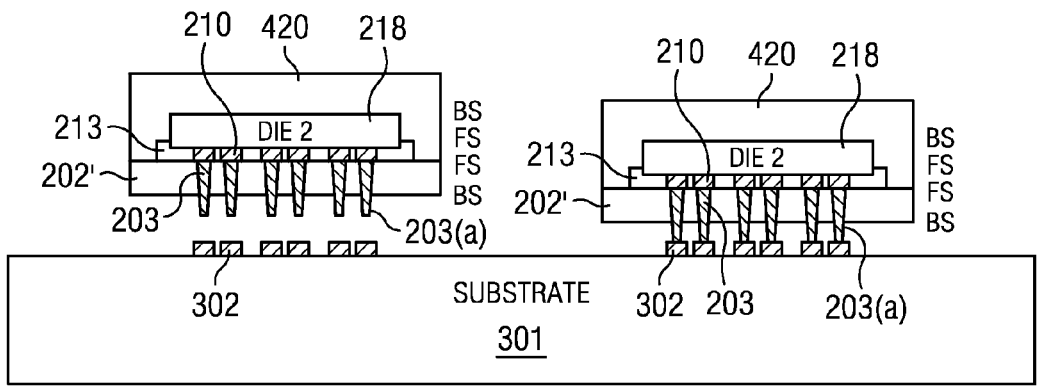
Figure 4F:
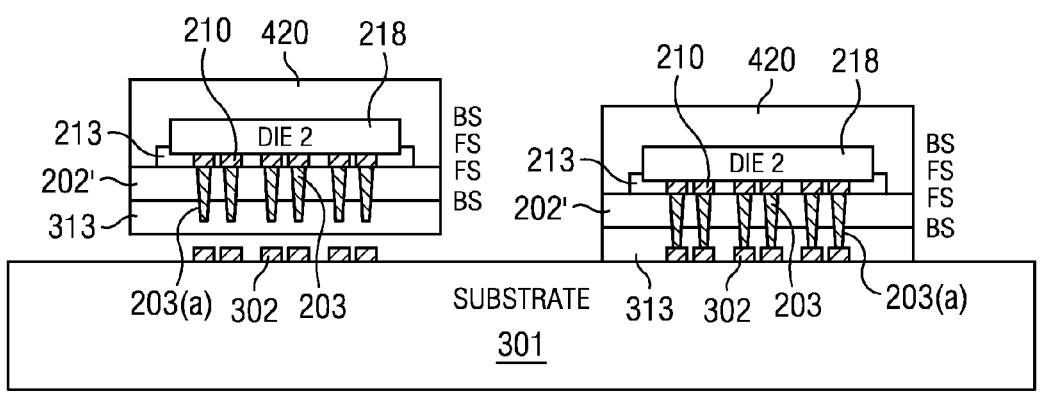

FIGS. 4D-E depict a mold comprising capillary underfill flow assembly option. FIG. 4D depicts the result following wafer sawing the molded die-wafer stack shown in FIG. 4C to provide a plurality of mold comprising singulated stacked die. FIG. 4E depicts mounting the mold comprising singulated stacked die onto a package substrate 301 that includes pads 302 using a process comprising TC bonding or mass reflow. FIG. 4F depicts the resulting structure after capillary underfill to dispose underfill 313 in the gap region between the bottom of the singulated stacked die and the surface of the substrate 301.

Figure 4G:
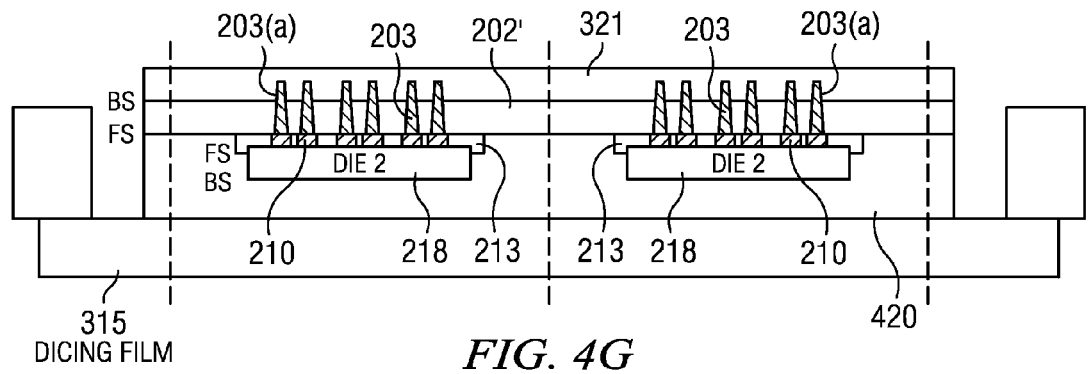
Figure 4H:
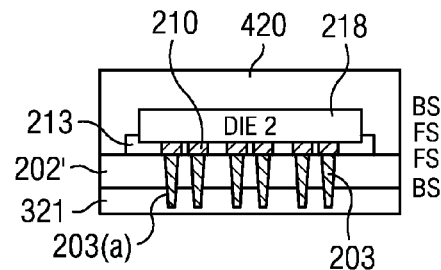
Figure 4I:
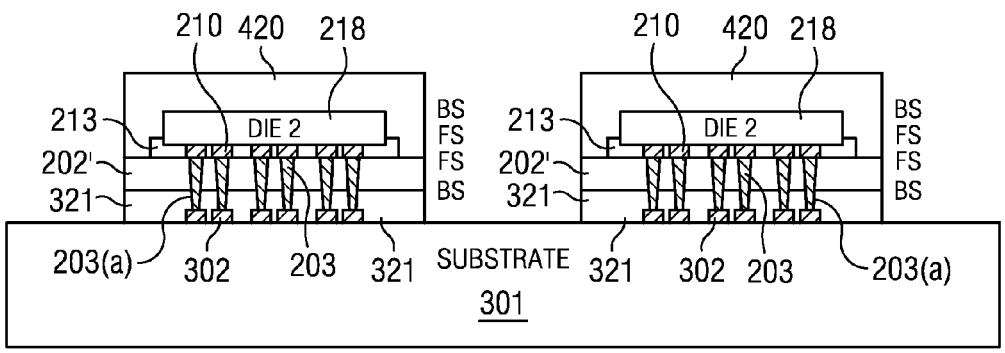

FIGS. 4G-I depict a mold-free pre-applied underfill assembly option. FIG. 4G depicts the structure after placing a CDF film 321 on the TSV tip side of molded die-wafer stack and mounting of the molded wafer stack TSV tip side up on a dicing film 315. FIG. 4H depicts a molded singulated stacked die provided following sawing the molded die-wafer stack on the dicing film 315 shown in FIG. 4G. FIG. 4I depicts the resulting structure after placing of molded singulated stacked die on a package substrate and compression bonding that results in bonding of the singulated stacked die to pads 302 on the package substrate 301 and also the formation of an underfill material from the CDF 321 between the molded singulated stacked die and the package substrate 301.

As described above, although protruding TSV tips 203(a) are shown above, in other embodiments of the invention the TSVs 209 are electrically accessible from the bottom side of the TSV wafer, but do not protrude from the bottom side of the wafer, such as when an RDL is included.

EXAMPLES

Embodiments of the invention are further illustrated by the following specific Examples, which should not be construed as limiting the scope or content of embodiments of the invention in any way.

Figure 5:
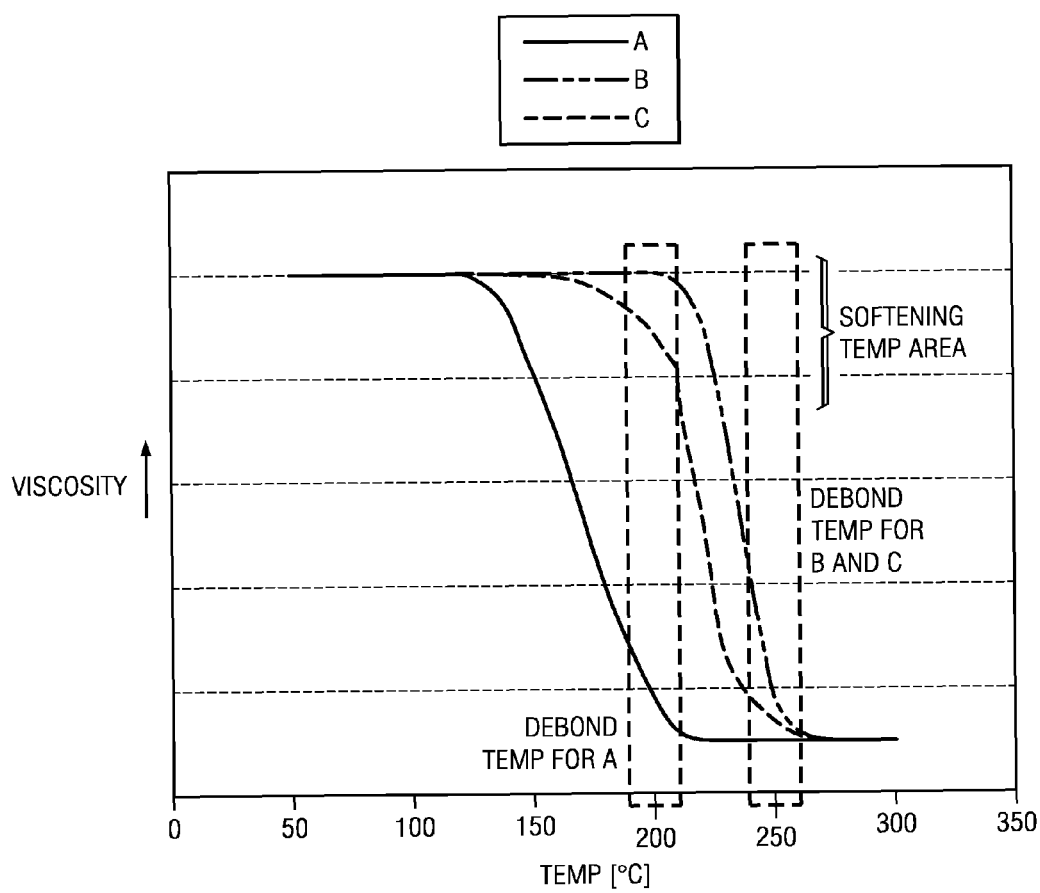
FIG. 5 is an exemplary viscosity vs. temperature plot showing some adhesive materials that provide different debonding temperatures that can be used with disclosed embodiments.

FIG. 5 is a graph of viscosity vs. temperature (° C.) for three different exemplary adhesive materials that can generally be used as the bonding adhesives described herein. Adhesive A can be used for the lower debonding temperature adhesive, and adhesives B or C for the higher debonding temperature adhesive. Softening temperature as used herein refers to the temperature at which the viscosity is the minimum viscosity required to stand against debonding, such at least 200 Pa·S. Curve A is the viscosity curve for the Brewer Science Wafer-BOND™ HT-10.10 coating manufactured by Brewer Science, Inc., Springfield, Mo. Curves B and C provide other viscosity curves for other materials that provide a higher debonding temp as compared to that shown in Curve A.

One exemplary higher debonding temperature adhesive is from Sumitomo 3M, which is a UV-curing adhesive. The UV-curing liquid adhesive can be used analogous to HT10.10 for carrier wafer attachment. With this UV-curing adhesive is possible to remove from the glass or other carrier by laser exposing to form small bubbles on the boundary to the glass, followed by removal from the wafer by removal tape. Sumitomo 3M is manufactured by Sumitomo 3M Ltd. has heat proof capability against debonding of about 250° C. as shown for curves B and C in FIG. 5.

In an exemplary sequence, the higher debonding temperature second adhesive is added to a TSV wafer having the lower bonding temperature adhesive on the other side, analogous to that shown in FIG. 2D. The second adhesive is then UV cured. The first adhesive is then selectively removed, such as around 200° C. for the first adhesive HT10.10, while leaving the second carrier wafer attached by the second adhesive. After die attach to the TSV wafer to form a die-wafer stack, laser exposing can be used for forming bubbles to remove the glass carrier and the UV cured material from die-wafer stack prior to singulation of the die-wafer stack to form singulated stacked die.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of the invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such a feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method of forming stacked electronic articles, comprising:
   mounting a first carrier wafer to a top side of a through substrate via (TSV) wafer including TSV die using a first adhesive material that has a first debonding temperature;
   thinning said TSV wafer from a bottom side of said TSV wafer to form a thinned TSV wafer, wherein said thinning includes exposing embedded TSV tips on said TSV wafer to form exposed TSV tips;
   mounting a second carrier wafer to said bottom side using a second adhesive material, wherein said second adhesive material has a second debonding temperature that is higher as compared to said first debonding temperature;
   heating said thinned TSV wafer to a temperature above said first debonding temperature to remove said first carrier wafer from said thinned TSV wafer, and
   bonding at least a second IC die onto said TSV die on said top side of said thinned TSV wafer to form a stacked TSV wafer comprising electronic article.

2. The method of claim 1, wherein said second IC die comprises at least one singulated IC die and said stacked TSV wafer comprising electronic article comprises a die-TSV wafer stack.

3. The method of claim 1, wherein said second IC die comprises a wafer said stacked TSV wafer comprising electronic article comprises a wafer-TSV wafer stack.

4. The method of claim 1, wherein said first adhesive material and said second adhesive material both comprise thermoplastics.

5. The method of claim 1, wherein said exposed TSV tips are protruding TSV tips that protrude at least 5 µm from a bottom side of said thinned TSV wafer.

6. The method of claim 1, further comprising providing a curable dielectric film (CDF) between said second IC die and said top side of said TSV wafer, and
wherein said bonding said second IC die comprises a heat pressing process that provides compression molding to form underfill from said CDF and jointing to bond said second IC die to form said stacked TSV wafer comprising electronic article in a single process step.

7. The method of claim 1, wherein said forming said stacked TSV wafer comprising electronic article further comprises underfilling with an underfill material or a non-conductive paste (NCP) after said bonding of said second IC die.

8. The method of claim 6, wherein said bonding said second IC die comprises flip chip bonding.

9. The method of claim 6, wherein said second IC die comprise a plurality of TSVs, and wherein said bonding said second IC die comprises face-up bonding of said second IC die.

10. The method of claim 1, further comprising:
removing said second carrier wafer from said stacked TSV wafer comprising electronic article, and
sawing said stacked TSV wafer comprising electronic article to form a plurality of singulated stacked IC die.

11. The method of claim 10, further comprising:
bonding at least one of said plurality of singulated stacked IC die to a package substrate having land pads thereon, and
capillary underfilling with an underfill material or a non-conductive paste (NCP).

12. The method of claim 10, wherein said exposed TSV tips are protruding TSV tips that protrude at least 5 µm from said bottom side of said thinned TSV wafer, further comprising:
providing a curable dielectric film (CDF) on said protruding TSV tips before said sawing,
placing at least one of said plurality of singulated stacked IC die on a package substrate having land pads thereon, and
bonding comprising a heat pressing process that provides compression molding to form underfill from said CDF and jointing to bond said protruding TSV tips of said singulated stacked IC die to said land pads of said package substrate in a single process step.

13. The method of claim 10, wherein said bonding said second IC die comprises flip chip bonding.

14. The method of claim 1, further comprising:
forming a mold layer comprising overmolding a mold material to cover said second IC die after said bonding said second IC die;
removing said second carrier wafer from said stacked TSV wafer comprising electronic article, and
sawing said stacked TSV wafer comprising electronic article to form a plurality of singulated stacked IC die.

15. The method of claim 14, further comprising bonding at least one of said plurality of singulated stacked IC die to a package substrate having land pads thereon and then capillary underfilling with an underfill material or a non-conductive paste (NCP).

16. The method of claim 14, wherein said exposed TSV tips are protruding TSV tips that protrude at least 5 µm from said bottom side of said thinned TSV wafer, further comprising:
providing a curable dielectric film (CDF) on said protruding TSV tips before said wafer sawing,
placing at least one of said plurality of singulated stacked IC die on a package substrate having land pads thereon, and
a second bonding comprising a heat pressing process that provides compression molding to form underfill from said CDF and jointing to bond said protruding TSV tips to said land pads of a package substrate in a single process step.

17. The method of claim 14, wherein said bonding said second IC die comprises flip chip bonding.

18. A method of forming stacked electronic articles, comprising:
mounting a first carrier wafer to a top side of a through substrate via (TSV) wafer including TSV die using a first adhesive material that has a first debonding temperature;
thinning said TSV wafer from a bottom side of said TSV wafer to form a thinned TSV wafer, wherein said thinning includes exposing embedded TSV tips on said TSV wafer to form exposed TSV tips;
mounting a second carrier wafer to said bottom side using a second adhesive material, wherein said second adhesive material has a second debonding temperature that is higher as compared to said first debonding temperature;
heating said thinned TSV wafer to a temperature above said first debonding temperature to remove said first carrier wafer from said thinned TSV wafer, and
flip chip bonding at least one singulated second IC die onto said TSV die on said top side of said thinned TSV wafer to form a die-wafer stack.

19. The method of claim 18, further comprising:
removing said second carrier wafer from said die-wafer stack, and
sawing said die-wafer stack to form a plurality of singulated stacked IC die.

20. The method of claim 19, wherein said exposed TSV tips are protruding TSV tips that protrude at least 5 µm from said bottom side of said thinned TSV wafer, further comprising:
providing a curable dielectric film (CDF) on said protruding TSV tips before said sawing,
placing at least one of said plurality of singulated stacked IC die on a package substrate having land pads thereon, and
bonding comprising a heat pressing process that provides compression molding to form underfill from said CDF and jointing to bond said protruding TSV tips of said singulated stacked IC die to said land pads of said package substrate in a single process step.

* * * * *